(12) United States Patent
Viehland et al.

(10) Patent No.: US 7,023,206 B2
(45) Date of Patent: Apr. 4, 2006

(54) MAGNETOELECTRIC MAGNETIC FIELD SENSOR WITH LONGITUDINALLY BIASED MAGNETOSTRICTIVE LAYER

(75) Inventors: Dwight Viehland, Blacksburg, VA (US); Shu-Xiang Dong, Blacksburg, VA (US); Jie-Fang Li, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 2 days.

(21) Appl. No.: 10/687,970

(22) Filed: Oct. 20, 2003

(65) Prior Publication Data

US 2004/0126620 A1    Jul. 1, 2004

Related U.S. Application Data

(60) Provisional application No. 60/419,102, filed on Oct. 18, 2002.

(51) Int. Cl.
*G01R 33/00* (2006.01)
*G01R 33/02* (2006.01)

(52) U.S. Cl. .................. 324/249; 324/244
(58) Field of Classification Search ........... 324/109, 324/151 R, 173–174, 244, 249, 260–263
See application file for complete search history.

(56) References Cited

U.S. PATENT DOCUMENTS 6,279,406 B1 *   8/2001   Li et al. ............... 73/861.77
6,387,476 B1 *   5/2002   Iwasaki et al. ............ 428/212
2001/0028245 A1 * 10/2001   Li et al. .................... 324/312

OTHER PUBLICATIONS

Clarke et al.; "The Impact of High-Temperature Superconductivity on SQUID Magnetometers"; Science 242 (4876); pp. 217-223; Oct. 14, 1988.
Nan et al.; "A Three-Phase Magnetoelectric Composite of Piezoelectric Ceramics, Rare-Earth Iron Alloys, and Polymer"; Applied Physics Letters; vol. 81, No. 20; pp. 3831-3833; Nov. 11, 2002.
Avellaneda et al.; "Magnetoelectric Effect in Piezoelectric/Magnetostrictive Multilayer (2-2) Composites"; Journal of Intelligent Material Systems and Structures, vol. 5; pp. 501-513; Jul. 1994.

(Continued)

*Primary Examiner*—Bot Ledynh
(74) *Attorney, Agent, or Firm*—Whitham, Curtis, Christofferson & Cook, PC (57) ABSTRACT

A magnetoelectric magnetic field sensor has one or more laminated magnetostrictive layers and piezoelectric layers. The magnetostrictive layers are magnetized by a bias magnetic field in a longitudinal, in-plane direction. The piezoelectric layers can be poled in the longitudinal direction or perpendicular direction. The longitudinal magnetization of the magnetostrictive layers provides greatly increased sensitivity at lower bias fields compared to other magnetoelectric sensors. Perpendicular poling of the piezoelectric layers tends to provide higher sensitivity at lower detection frequency (e.g. less than 1 Hz). Longitudinal poling tends to provide higher sensitivity at high detection frequency (e.g. above 10 Hz). Also included are embodiments having relative thicknesses for the magnetostrictive layers that are optimized for sensitivity. Equations are provided for calculating the best relative thickness for the magnetostrictive layer for maximum sensitivity.

22 Claims, 5 Drawing Sheets

OTHER PUBLICATIONS

Bichurin et al.; "Theory of Low-Frequency Magnetoelectric Effects in Ferromagnetic-Ferroelectric Layered Composites"; Journal of Applied Physics, vol. 92, No. 12; pp. 7681-7683; Dec. 15, 2002.

Srinivasan et al.; "Magnetoelectric Effects in Bilayers and Multilayers of Magnetostrictive and Piezoelectric Perovskite Oxides"; Physical Review B, vol. 65, 134402; 2002.

Nan et al.; Coupled Magnetic-Electric Properties and Critical Behavior in Multiferroic Particulate Composites; Journal of Applied Physics, vol. 94, No. 9; pp. 1-7; Nov. 1, 2003.

Srinivasan et al.; "Giant Magnetoelectric Effects in Layered Composites of Nickel Zinc Ferrite and Lead Zirconate Titanate"; Solid State Communications 124; pp. 373-378; 2002.

Ryu et al.; "Magnetoelectric Properties in Piezoelectric and Magnetostricitve Laminate Composites"; Japan Journal of Applied Physics, vol. 40; pp. 4948-4951; 2001.

Dong et al. "Ultrahigh magnetic field sensitivity in laminates of TERFENOL-D and Pb (Mg 1/3 Nb 2/3) $O_3$-$PbTiO_3$crystals" Applied Physics Letters, vol. 83, No. 11; ppg. 2265-2267, dated Sep. 15, 2003.

* cited by examiner

Fig. 6   Bias Field in Oersteds
(detected field at 1 kHz)

Fig. 7

Calculated sensitivity for 3-layer sensor with L-L configuration made of TERFENOL-D and PZT-5.

Fig. 8

Calculated sensitivity for 3-layer sensor with L-P configuration made of TERFENOL-D and PZT-5.

Fig. 9

MAGNETOELECTRIC MAGNETIC FIELD SENSOR WITH LONGITUDINALLY BIASED MAGNETOSTRICTIVE LAYER

CROSS-REFERENCE TO RELATED APPLICATIONS

This application claims priority to U.S. Provisional Application Ser. No. 60/419,102 filed Oct. 18, 2002.

STATEMENT OF GOVERNMENT INTEREST

This invention was made with government support under Grant Numbers 414167, 430955 and 430948 awarded by the Office of Naval Research. The Government has certain rights in the invention.

FIELD OF THE INVENTION

The present invention relates generally to magnetic field sensors. More specifically, the present invention relates to a magnetic field sensor having laminated piezoelectric and magnetostrictive layers in which the magnetostrictive layers are biased in a direction parallel with the layer plane.

BACKGROUND OF THE INVENTION

Magnetic sensors are used in many applications such as rotational and torque sensors for motors, proximity sensors for anomaly detection and the like. Magnetic sensors can also be used for biomedical imaging if made sensitive enough.

Long-range proximity detectors and biomedical imaging devices require magnetic field sensitivity on the order of 1 picoTesla/$\sqrt{Hz}$ or better. Superconducting quantum interference devices (SQUIDs) exceed this sensitivity, but are very expensive and power-consumptive since they require cryogenic cooling. Other sensors such as fiber optic magnetometers and fluxgate magnetometers are less expensive than SQUIDs, but in theory have a lower sensitivity on the order of 10 pT/$\sqrt{Hz}$ that in practice has not been achieved.

Also, long-range proximity sensors and magnetic imaging devices would find broader applications if they require very little power or operate passively. This would enable remote and portable operation of magnetic sensors, for which there are applications in proximity sensing and monitoring. Optical magnetometers and fluxgate magnetometers require too much power to be operated remotely; and also, in practice have failed to achieve their theoretical sensitivity levels. Coil type sensors are passive, but have limited frequency operational ranges and low sensitivity.

It would be an advance in the art of magnetic sensing technology to provide a highly sensitive magnetic field sensor that is inexpensive, requires very little operating power, and which can operate at low frequencies.

U.S. Pat. No. 5,675,252 to Podney describes a sensitive, passive magnetic field sensor comprising laminated magnetostrictive and piezoelectric layers. When exposed to a varying magnetic field, strain in the magnetostrictive layers is coupled to the piezoelectric layers, thereby creating a voltage that is detected. Podney employs a large number of layers to provide high sensitivity. Podney does not teach any particular direction for the bias magnetic field or magnetization of the device.

U.S. Pat. No. 6,279,406 to Li et al. also teaches a magnetic field sensor comprising a bonded magnetostrictive layer and a piezoelectric layer. Li et al. fails to teach an optimal configuration for a magnetostrictive/piezoelectric magnetic field sensor.

SUMMARY

The present invention includes a magnetoelectric magnetic field sensor having a magnetostrictive layer with a longitudinal magnetization, wherein the magnetostrictive layer has a length in the magnetization direction that is greater than a transverse length. The longitudinal direction is parallel with the layers. A piezoelectric layer is bonded to the magnetostrictive layer.

The sensor may further comprise a means (e.g. permanent magnet or electromagnet) for providing a longitudinal bias magnetic field in the magnetostrictive layer. The bias field can have a strength of about 200–1000 Oersteds, for example.

The piezoelectric layer can be poled in a direction perpendicular to the layers, or in the longitudinal direction.

The magnetostrictive layer can be 1.5, 3, 4 5, 10 100 or more times longer in the longitudinal direction than the transverse direction.

The sensor can comprise any number of magnetostrictive layers, and any number of piezoelectric layers.

Additionally, the present invention includes magnetic field sensors wherein adjacent magnetostrictive layers and piezoelectric layers have a thickness ratio selected to provide optimum sensitivity. Equations are provided for calculating the optimum thickness ratio.

DETAILED DESCRIPTION

The present invention provides a magnetoelectric magnetic field sensor with extremely high sensitivity and low operating power requirements. The present sensor is sensitive enough to potentially provide long range (e.g. 0.01–1 km) sensing of vehicles and shorter range (<1 m) biomedical imaging (e.g. magnetoencephalographic imaging and magnetocardiac imaging).

The present sensor has laminated magnetostrictive (MS) and piezoelectric (PZ) layers. An applied magnetic field strains the MS layer, which strains the PZ layer, thereby creating a detected output voltage. Significantly, the MS layer is magnetized by a bias field in a direction parallel to the plane of the MS layer (a longitudinal direction). Also, the magnetization layer has a length in the direction parallel with the magnetization that is greater than the transverse width. Additionally, the MS layers and PZ layers have an optimum thickness ratio for obtaining a maximum sensitivity. These three features provide exceptional sensitivity to magnetic fields, even with a relatively small bias magnetic field. The PZ layer can be poled longitudinally or perpendicularly.

Figure 1:
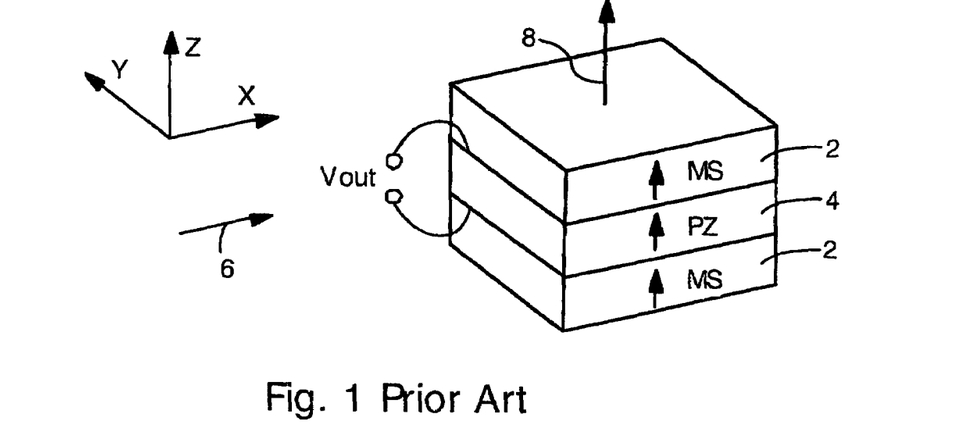
FIG. 1 (Prior Art) Shows a schematic diagram of a magnetoelectric magnetic field sensor with a perpendicular-perpendicular (PP) configuration.

FIG. 1 shows a laminated magnetostrictive-piezoelectric (magnetoelectric) magnetic field sensor according to the prior art. The sensor has a piezoelectric (PZ) layer 4 disposed between two magnetostrictive (MS) layers 2. The MS layers 2 are each magnetized in a direction perpendicular to the layers (the Z direction). A bias magnetic field 8 oriented in the Z direction provides the perpendicular magnetization of the MS layers 2. Also, the PZ layer is poled in the Z direction. The magnetization direction and poling direction are indicated by arrows. This configuration with perpendicular MS magnetization and perpendicular PZ poling is referred to as a perpendicular-perpendicular (P-P) configuration. When an external magnetic field 6 changes, the MS layers 2 are strained. Strain variations in the MS layers 2 are transferred to the PZ layer 4, thereby creating an output voltage Vout, typically between the top and bottom surfaces of the PZ layer. The present inventors have found that the sensitivity of the device of FIG. 1 is relatively low as a result of the perpendicular magnetization of the MS layers 2, among other factors. Also, the present inventors have found that the bias field required to operate the device of FIG. 1 is unnecessarily high.

Figure 2:
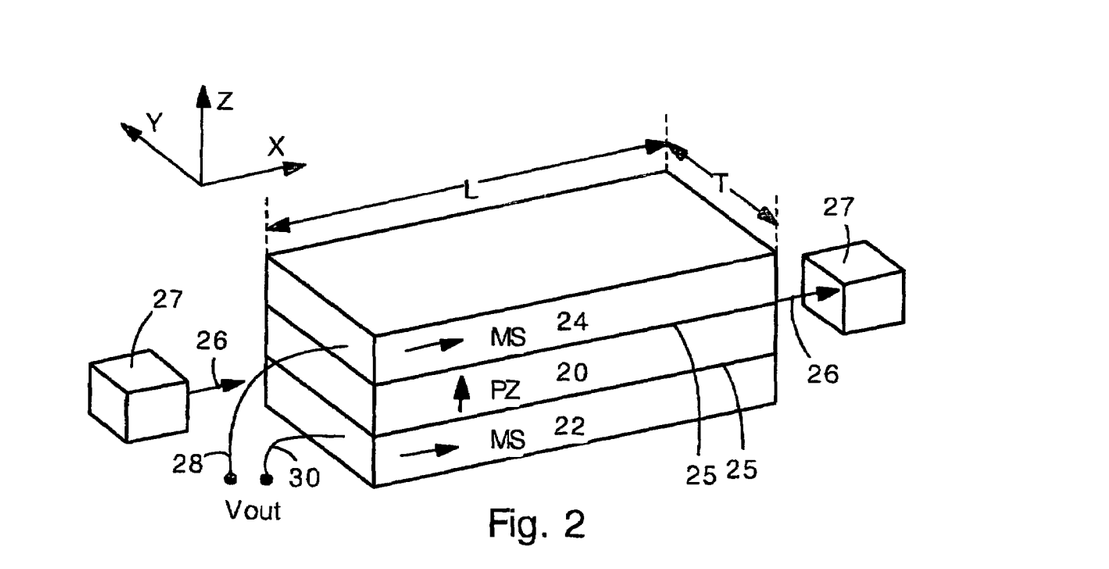
FIG. 2 Shows a first embodiment of the present invention with a L-P configuration.

FIG. 2 shows a magnetoelectric magnetic field sensor according to the present invention. The sensor has a PZ layer 20 bonded to and disposed between MS layers 22 24. The MS layers 22 24 and PZ layers are bonded by adhesive layers 25. The device has a longitudinal dimension L and a transverse dimension T. The device has a L/T aspect ratio, which is the ratio of the longitudinal dimension L to the transverse dimension T. In the present invention, the L/T aspect ratio is greater than 1, and can be 2, 4, 10, 20, 100 or higher. The MS layers 22 24 are necessarily magnetized in a direction parallel with the longitudinal direction L. A bias magnetic field 26 is applied in the longitudinal direction so that the MS layers 22 24 have enhanced sensitivity; the bias field 26 also assures the magnetization of the MS layers 22 24 is oriented in the longitudinal direction. The strength of the bias field is adjusted so that the magnetization and strain of the MS layers 22 24 are maximally sensitive to changes in magnetic field. The bias field 26 can be applied by permanent magnets 27, for example. Alternatively, the bias field 26 can be applied by a solenoid winding around the device.

Another important parameter is the ratio of the aggregate thickness of the MS layers to the total device thickness. The optimum thickness ratio depends on the MS material and PZ material. Equations for determining the optimal MS thickness/device thickness ratio are provided below. Typically the optimal MS/total device thickness ratio is about 0.5–0.8.

The longitudinal dimension L and transverse dimension T are not limited. They can each be in the range of about 1–100 mm, for example. The thickness of each layer is also not limited. In typical devices, the thickness of the layers 20 22 24 can be in the range of about 0.01–5 mm, for example.

Output wires 28 30 are electrically connected to the top and bottom surfaces of the PZ layer 20, which provides the output voltage. In the embodiment of FIG. 2, the output wires are connected to the MS layers 22 24 which are electrically conductive and in electrical contact with the PZ layer 20.

In the embodiment of FIG. 2, the PZ layer 20 is poled in the Z direction, perpendicular to the layers. The configuration of FIG. 2 is referred to as a L-P configuration, since the MS magnetization is longitudinal and the PZ poling is perpendicular.

The adhesive layers 25 can comprise many different kinds of adhesives such as high strength epoxy, braze, solder or the like. If epoxy is used, it should be processed (e.g. exposed to vacuum) so that voids or air bubbles are not present in the adhesive layer 25. Also, in the embodiment of FIG. 2 the epoxy layer should be thin (~5 µm) and conductive (e.g. metal-filled) to provide electrical contact between top and bottom surfaces of the PZ layer 20 and the MS layers 22 24. It is also noted that a thin epoxy bond is preferred because epoxy tends to absorb and dissipate mechanical energy, thereby reducing sensitivity; a thin epoxy layer (e.g. 10 microns or less) minimizes this undesirable effect.

The MS layers 22 24 can be made of many different magnetostrictive materials that have either a positive or negative magnetostrictive coefficient. Preferably, the magnetostrictive coefficient is as high as possible. Examples of suitable MS materials include nickel, iron-gallium alloys, iron-cobalt alloys, and TERFENOL-D (TERFENOL-D is a tradename for a Tb—Dy—Fe intermetallic compound with a large positive magnetostrictive coefficient). The MS layers 22 24 can be the same or different materials, and in some applications of this invention only one of the MS layers 22 24 may be required.

The PZ layer 20 can be made of many different piezoelectric materials and can be crystalline or multicrystalline. Examples of suitable PZ materials include PZT (lead zirconium titanate), PMN-PT (crystalline or multicrystalline), PZN-PT, and quartz. The piezoelectric coefficient of the PZ material should be as high as possible. However, it is important to note that PZ materials typically have several piezoelectric coefficients and that the most important coefficient depends upon the device geometry. In the device of FIG. 2, with a perpendicularly-poled PZ layer, the most important piezoelectric coefficient is the d31 coefficient (d31 piezoelectric constant). Preferably, the d31 piezoelectric coefficient is as large as possible in the L-P device of FIG. 2.

In operation, the bias field 26 is applied, and the output wires 28 30 are connected to a high-impedance (e.g. 10 MegaOhm or higher) differential amplifier (not shown) or other device that can detect small induced voltages (e.g. from nV to V for sensing fields). The sensor is located within a time-varying magnetic field to be detected. Preferably, the sensor is oriented so that the detected magnetic field changes the magnetic field component parallel with the longitudinal direction (e.g. varies the amplitude of the bias field 26). When the magnetic field in the longitudinal direction changes, the magnetization of the MS layers 22 24 changes. As a result, the MS layers 22 24 are strained in the longitudinal direction, and the PZ layer 20 is strained in the longitudinal direction. The PZ layer 20 creates a voltage at the output wires 28 30 indicative of the detected magnetic field.

There are geometric requirements in the laminate design for achieving optimum sensitivity. Providing the laminated magnetostrictive/piezoelectric layers with a large L/T aspect ratio (e.g. greater than 2 or 4) and a relatively large cross-sectional area helps to assure enhanced sensitivity. A high L/T aspect ratio enhances the laminate's sensitivity because it favors the principle vibration mode along the length direction, which is the maximally sensitive direction for the magnetostrictive layers. A high cross-sectional area in the magnetic field direction (i.e. T-dimension multiplied by height in Z-direction for a rectangular device) increases the laminate's sensitivity because the device will capture a larger magnetic flux.

Preferably, the bias field 26 is adjusted so that the strain in the MS layers 22 24 has maximum sensitivity to small fluctuations in the detected magnetic field. In the present sensors, there exists an optimal bias field for maximum sensitivity; a bias field too large or too small will produce less than maximum sensitivity. Typically, the optimal bias field is in the range of about 200–1000 Oersteds. However, the optimal bias field depends upon a number of factors including the elastic properties of the piezoelectric material and magnetostrictive material, the magnetostrictive coefficient of the MS material, and the piezoelectric coefficient of the PZ material.

Figure 3:
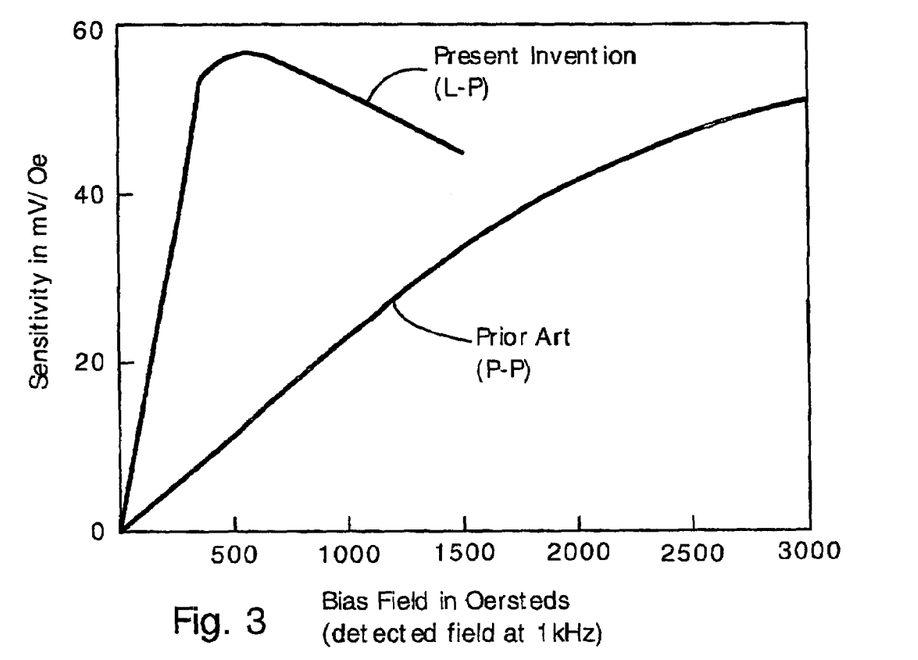
FIG. 3 is a graph of sensitivity versus bias field for the present L-P device and a prior art P-P device.

FIG. 3 is a graph of sensitivity versus bias field for the present L-P device of FIG. 2 and the prior art P-P device of FIG. 1. Both devices were made with two TERFENOL-D MS layers and a single, multicrystalline soft PZT layer disposed between the MS layers, as illustrated in FIGS. 1 and 2. The sensitivity of both devices was measured at many different bias levels using a detected magnetic field frequency of 1 kHz. The sensitivity is expressed in mV of voltage output per Oersted (mV/Oe) of the detected magnetic field.

FIG. 3 illustrates that the present L-P configuration achieves a maximum sensitivity of about 55 mV/Oe at a bias field of about 500 Oe. This L-P laminate had an aspect ratio of L/T=2, and a MS/total device thickness ratio of n=0.7. The prior art P-P device requires a much stronger bias field of about 3000–3500 Oersteds to achieve a comparable sensitivity. A great advantage of the present invention is that high sensitivity is achieved with a relatively modest bias field. The high bias field requirement of the P-P configuration renders it impractical for use in many applications. Creating a bias field of 3500 Oersteds requires large and costly permanent magnets or a large, power-consumptive electromagnet. Hence, the present L-P sensor can be much smaller and less expensive than the prior art devices and still provide high sensitivity.

Figure 4:
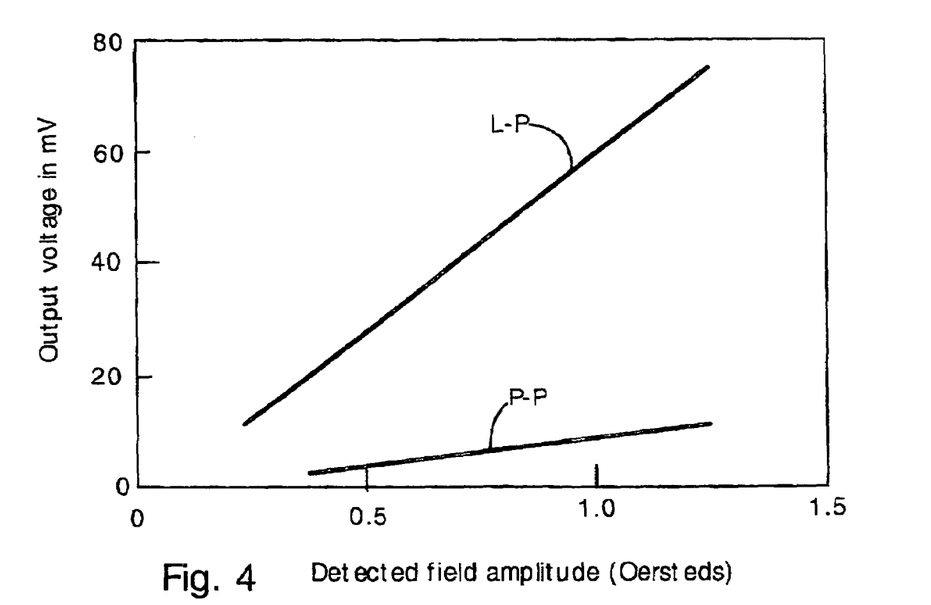
FIG. 4 is a graph of output voltage (in mV) versus time-varying field amplitude.

FIG. 4 is a graph of output voltage versus detected field strength for L-P and P-P devices. The bias field strength is 500 Oe and the detected field frequency is 1 kHz. The P-P and L-P devices are both made of TERFENOL-D and a soft PZT. They had an aspect ratio of L/T=2, and a MS/total layer thickness ratio of n=0.7. The present L-P configuration has a sensitivity about 7–8 fold greater than the P-P configuration.

Figure 5:
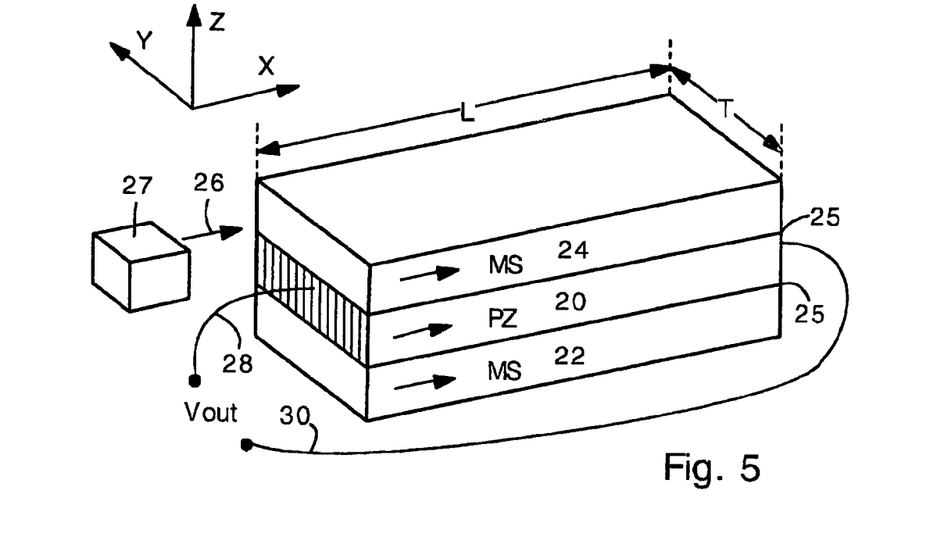
FIG. 5 shows a second embodiment having a L-L configuration in which the magnetostrictive layers are longitudinally magnetized, and the piezoelectric layer is longitudinally poled.

FIG. 5 shows an alternative embodiment of the present invention in which the PZ layer 20 is poled in the longitudinal direction. The MS layers 22 24 are magnetized in the longitudinal direction. This configuration is referred to as an L-L configuration. Since the PZ layer 20 is poled in the longitudinal direction, the output wires 28 30 are connected to longitudinal ends of the PZ layer 20, which are preferably metallized. Output wire 30 is connected to the right-side edge of PZ layer, which is not visible. In the device of FIG. 5, the most important piezoelectric coefficient is the d33 coefficient because it has the greatest effect on the voltage output of the longitudinally poled PZ layer when it is strained longitudinally. Preferably, the d33 piezoelectric coefficient is as large as possible in the L-L device of FIG. 5.

Any magnetostrictive materials can be used in the L-L configuration including nickel, iron-gallium alloys, iron-cobalt alloys, and TERFENOL-D. Also, any longitudinally-polarizable piezoelectric materials can be used in the L-L configuration including PZT, PMN-PT (crystalline or multicrystalline), PZN-PT, and quartz. The adhesive 25 in the L-L configuration is preferably electrically insulating and provide electrical isolation between the MS layers 22 24 and the PZ layer 20. This is because the MS layers 22 24 are typically conductive and can short-circuit the two ends of the PZ layer.

Figure 6:
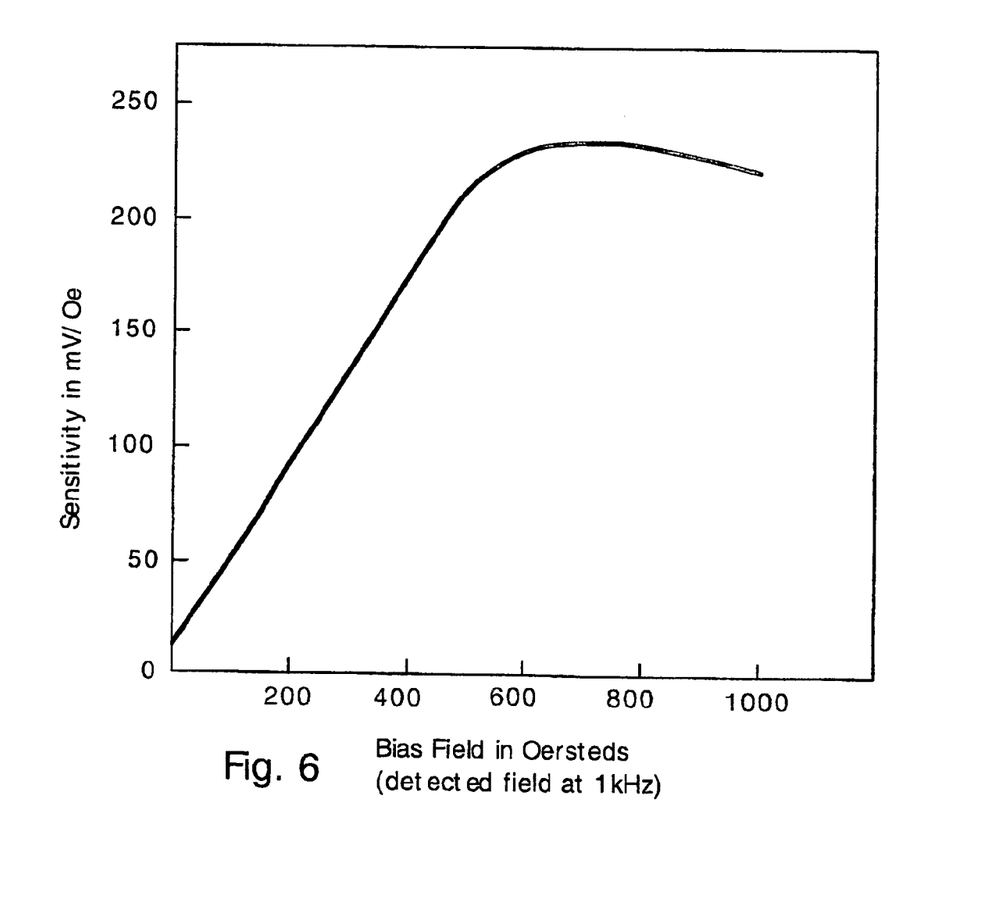
FIG. 6 is a graph of sensitivity versus bias field for the present L-L device.

The L-L configuration of FIG. 5 has a sensitivity even higher than the L-P device of FIG. 2. FIG. 6, for example, shows a graph of sensitivity versus bias field for the present L-L device of FIG. 5. The L-L device used to generate FIG. 6 is made with two TERFENOL-D MS layers and a longitudinally-poled single crystal PMN-PT layer disposed between the MS layers. The sensitivity was measured using a detected magnetic field with a frequency of 1 kHz. At a bias field of 600–800 Oe, the L-L device has an extremely high sensitivity of over 225 mV/Oe. The extremely high sensitivity of the L-L configuration is partly a result of the d33 piezoelectric constant, which is typically higher than the d31 piezoelectric constant employed in the L-P configuration, and partly due to the small capacitance (i.e. capacitance between output wires 28 30) of this laminate design. Assuming that the induced charge Q from the piezoelectric layer is the same for both the L-T and L-L, a small capacitance C means a higher induced voltage according to V=Q/C. Also, the piezoelectric material PMN-PT used in the device that generated the graph of FIG. 6 has an exceptionally high d33 piezoelectric constant.

An important consideration in the design and operation of the present magnetic field sensors is the frequency of the detected magnetic field. In all the data presented above, the detected magnetic field had a frequency of 1 kHz. Different applications will require sensitivity to different frequencies. For example, magnetoencephalography and biomedical imaging applications will typically require sensitivity to frequencies in the range of $10^{-2}$ to $10^2$ Hz. Proximity detection of vehicles and the like may require sensitivity to frequencies as low as $10^{-3}$ Hz. Detecting relatively high frequencies (e.g. 10 or 1000 Hz) is much easier than detecting low frequencies below 1 Hz. This is because the combination of the piezoelectric layer and voltage detector inherently comprises a high-pass R-C filter. For combinations of typical sensor designs (e.g. with L and T dimensions of about 4–10 mm and layer thicknesses of about 0.2–1 mm) and commercially available differential amplifiers, the RC cutoff frequency is often about several Hertz.

Figure 7:
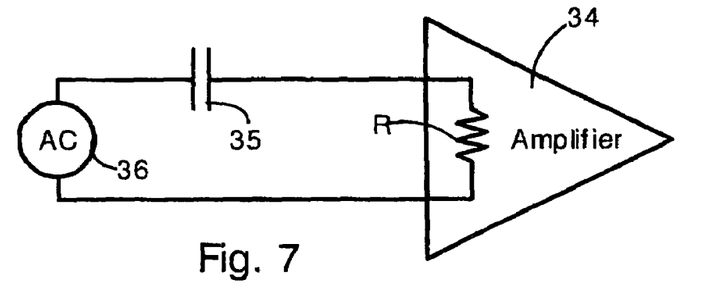
FIG. 7 shows an equivalent circuit for the present sensor connected to a differential amplifier with input impedance R.

FIG. 7 shows an equivalent circuit for the PZ layer (of the L-L or L-P configuration) coupled to a differential amplifier 34 having an internal impedance R. The piezoelectric material acts as an AC voltage source 35 in series with a capacitor 36. The voltage of the AC source 35 is the piezovoltage induced by strain, and the capacitance is the capacitance between the two metal electrode faces of the piezoelectric material. Therefore, for high sensitivity at low frequencies (e.g. below 1 or 0.1 Hz), the input impedance R should be as high as possible and the capacitance of the capacitor 36 should be as high as possible. For typical L-P devices in combination with an amplifier having an input impedance of about 15 megaOhm, the R-C cutoff frequency is about 0.5 Hz.

The L-P configuration has an advantage in this regard because the top and bottom electrode surfaces provide a relatively high capacitance because they have high surface area and are separated by the thin PZ layer thickness. Typical capacitances for L-P devices (with dimensions of several millimeters per side) are about 1–5 nF. The L-L configuration will typically have a lower capacitance because the electrodes are located on the endfaces of the PZ layer, which are widely separated and have small surface area. L-L devices can have capacitances 100 times smaller than a L-P device with similar dimensions. Therefore, although the L-L configuration typically provides higher sensitivity to magnetic fields of frequency 10 Hz and higher, the L-P configuration will probably provide higher sensitivity to fields at low frequency (below 1 Hz). The frequency range of both L-P and L-L devices can be extended to lower frequencies by employing voltage detection amplifiers with higher input impedances or by designing the sensors to have higher capacitances. For example, the sensors can be designed with many PZ layers to increase the capacitance and therefore the sensitivity to low frequencies.

Another important consideration in the design of the present sensors is the relative thickness of the MS and PZ layers. Extremely thin PZ layers will provide relatively low sensitivity, because thin PZ layers produce little electrical charge. Also, extremely thin MS layers will provide poor sensitivity because thin MS layers will not be able to provide enough force to strain the PZ layers. There exists an optimum relative thickness for the MS and PZ layers. The optimum relative thickness is different for the L-P and L-L configurations.

For the L-P configuration, the following equation 1 provides the sensitivity (in volts per Oersted) as a function of the aggregate relative thickness of the MS layers. Equation 1 assumes that the device has N+1 MS layers, and N PZ layers.

$$\left|\frac{dV}{dH_3}\right|_{(L-P)} = \beta \frac{n(1-n)d_{33,m}d_{31,p}^2 w[(N+1)t_m + Nt_p]}{N\varepsilon_{33}^T s_{11}^E [ns_{11}^E (1-k_{31,p}^2) + (1-n)s_{33}^H]}. \quad \text{Equation 1}$$

wherein:
w is the width (transverse dimension T) of the laminate,
$t_m$ is the thickness of each magnetostrictive layer;
$t_p$ is the thickness of each piezoelectric layer;
$S_{33}^H$ is the elastic compliance of the magnetostrictive material under constant magnetic bias field, H.
$S_{11}^E$ is the elastic compliance of the piezoelectric material under constant electric field, E.
$d_{33,m}$ is the longitudinal magnetostrictive constant,
$d_{31,p}$ is the perpendicular piezoelectric constant,
$\epsilon_{33}^T$ is the permittivity of the piezoelectric material under constant stress,
n is the thickness ratio of (N+1) magnetostrictive layers to the total thickness,
$\beta$ (0<$\beta$≦1) is a coefficient related to dc magnetic bias. Under an optimum dc magnetic bias, $\beta$ is equal to 1.

When dV/dH of equation 1 is maximized, it will give the total MS thickness/total device thickness ratio that provides the greatest sensitivity for devices that have the L-P configuration. However, in order to design a device with optimum sensitivity, the thickness ratio for individual layers must also be specified. The optimum MS/PZ thickness ratio for individual layers in L-P devices is given by the following equation:

$$n_{optim} = \frac{1}{1+\sqrt{\alpha}}, \text{ where } \alpha = \frac{\varepsilon_{33}^S}{\varepsilon_{33}^T}\frac{s_{11}^E}{s_{33}^H} = (1-k_{31,p}^2)\frac{s_{11}^E}{s_{33}^H}. \quad \text{Equation 2}$$

wherein
$\epsilon_{33}^T$ is the permittivity of the piezoelectric material under constant stress,
$S_{11}^E$ is the elastic compliance of the piezoelectric material under constant electric field E,
$S_{33}^H$ is the elastic compliance of the magnetostrictive material under constant magnetic bias field H,
$\epsilon_{33}^S$ is the permittivity of the piezoelectric material under constant strain, and
$k_{31,p}$ is the electromechanical coupling factor of PZ, which is related to the fraction of energy transduced between electrical and mechanical forms, and vice versa.

For the L-L configuration, the following equation 3 provides the sensitivity (in volts per Oersted) as a function of the MS layer relative thickness. Equation 3 also assumes that the device has N+1 MS layers, and N PZ layers.

$$\left|\frac{dV}{dH_3}\right|_{L-L} = \beta \frac{n(1-n)d_{33,m}d_{33,p}g_{33,p}w[(N+1)t_m + Nt_p]}{s_{33}^E[ns_{33}^E(1-k_{33}^2) + (1-n)s_{33}^H]} \quad \text{Equation 3}$$

wherein:
w is the width (transverse dimension T) of the device,
$t_m$ is the thickness of each magnetostrictive layer,
$t_p$ is the thickness of each piezoelectric layer,
$S_{33}^H$ is the elastic compliance of the magnetostrictive material under constant magnetic bias field H,
$S_{33}^E$ is the elastic compliance of the piezoelectric material under constant electric field E,
$d_{33,m}$ is the longitudinal magnetostrictive constant,
$d_{33,p}$ is the longitudinal piezoelectric constant,
$g_{33,p}$ is the longitudinal piezoelectric voltage constant, and
n is the thickness ratio of (N+1) magnetostrictive layers to the device,
$\beta$ (0<$\beta$≦1) is a coefficient related to dc magnetic bias. Under an optimum dc magnetic bias, $\beta$ is equal to 1.

When dV/dH of equation 3 is maximized, it will give the total MS thickness/total device thickness ratio that provides the greatest sensitivity for devices that have the L-L configuration. However, in order to design a device with optimum sensitivity, the thickness ratio for individual layers must also be specified. The optimum MS/PZ thickness ratio for individual layers in L-L devices is given by the following equation:

$$n_{optim} = \frac{1}{1+\sqrt{\alpha}}, \text{ where } \alpha = \frac{s_{33}^D}{s_{33}^H}. \quad \text{Equation 4}$$

wherein
$S_{33}^H$ is the elastic compliance of the magnetostrictive material under constant magnetic bias field H. And,
$S_{33}^D$ is the elastic compliance of the piezoelectric material under constant electric displacement D.

The optimum thickness ratio, $n_{optim}$, is dependent only on the elastic compliance constants of the MS and PZ layers, and on the electromechanical coupling factor of the PZ layer.

Figure 8:
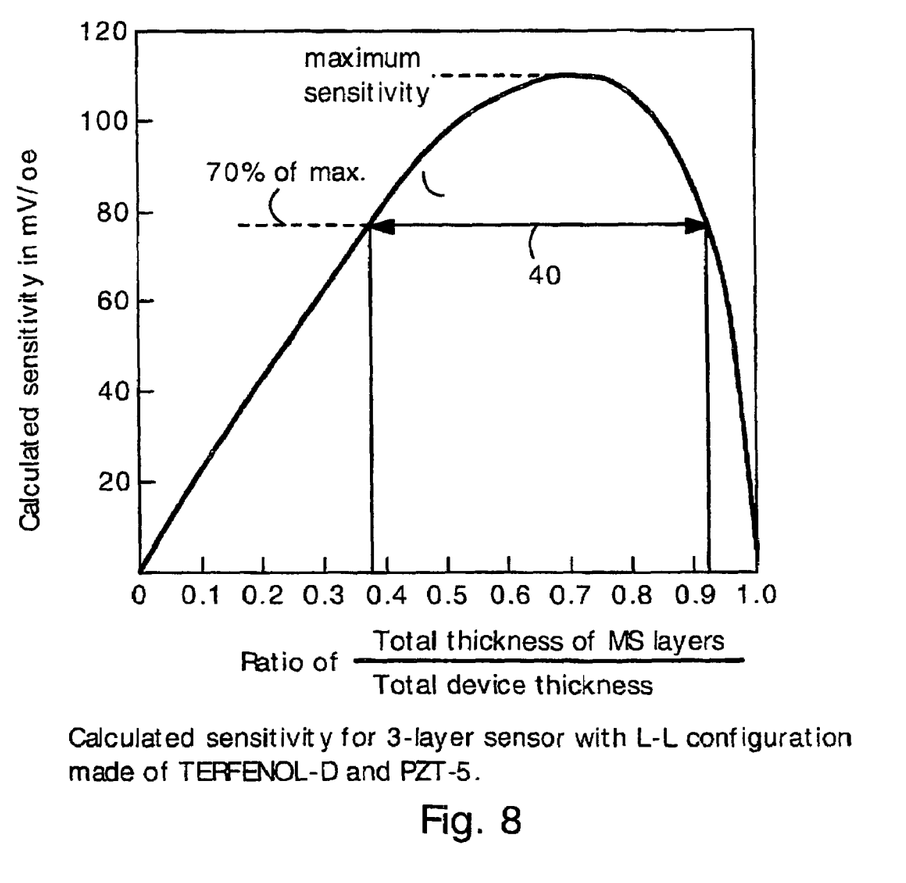
FIG. 8 is a plot of calculated sensitivity as a function relative thickness of the magnetostrictive layers for an exemplary device having the L-L configuration.

FIG. 8 shows a plot of sensitivity in mV/Oe versus relative thickness of the MS layers as calculated by equation 3 for a 3-layer (2 MS layers and 1 PZ layer) L-L device made of TERFENOL-D and a soft PZT. It is important to note that the relative thickness is the ratio of the combined thickness of both the TERFENOL-D layers to the total thickness of the entire device (e.g. a ratio of 0.9 indicates the MS layers comprise 90% of the device thickness). The FIG. 8 plot indicates that the highest sensitivity occurs when the TERFENOL-D layers have a relative thickness that comprises about 60–80% of the total device thickness. Of course, it is noted that the shape of the curve in FIG. 8 depends greatly upon the MS and PZ materials selected. Also it is noted that the thickness of the adhesive 25 is assumed to be negligible.

Figure 9:
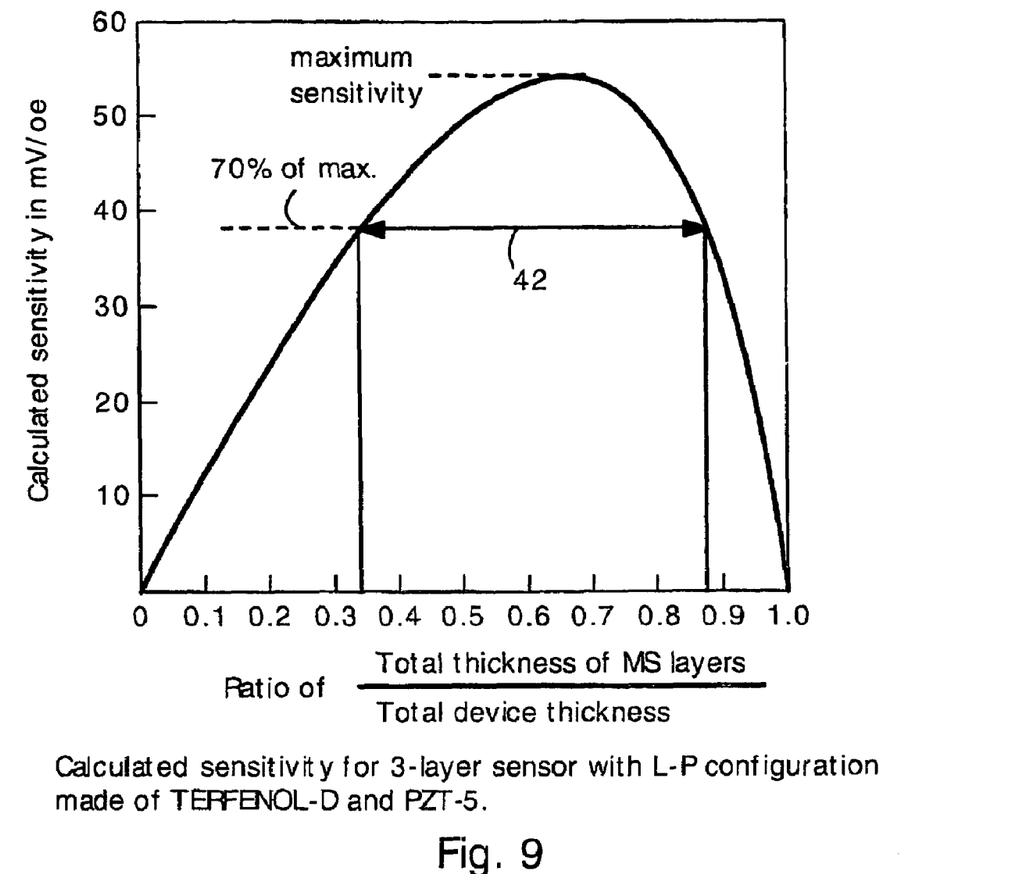
FIG. 9 is a plot of calculated sensitivity as a function relative thickness of the magnetostrictive layers for an exemplary device having the L-P configuration.

FIG. 9 shows a plot of sensitivity in mV/Oe versus relative thickness of the MS layers as calculated by equation 3 for a 3-layer (2 MS layers and 1 PZ layer) L-P device made of TERFENOL-D and PZT. The FIG. 9 plot indicates that the highest sensitivity occurs when the TERFENOL-D layers have a relative thickness that comprises about 50–80% of the total device thickness. Of course, it is noted that the shape of the curve in FIG. 9 depends greatly upon the MS and PZ materials selected. Also it is noted that the thickness of the adhesive 25 is assumed to be negligible.

Additionally, FIGS. 8 and 9 assume that an optimal longitudinal bias magnetic field is applied (i.e. $\beta=1$). The coefficient $\beta$ changes FIGS. 8 and 9 according to the effect of the bias magnetic field on the device sensitivity. If the bias field is not optimal, $\beta$ will be less than 1, and the maximum sensitivity will be reduced. As the bias field changes, the MS layer/total device thickness ratio that provides the maximum sensitivity will remain unchanged. The shape of the curves in FIGS. 8 and 9 will remain unchanged if the bias field is changed.

In a preferred embodiment of the invention, the sensor is designed so that the relative thickness of the MS layers is selected so that the device sensitivity is at least 70% or 85% of the maximum sensitivity as calculated by equation 1 or equation 3. The range of relative thickness ratios that provide sensitivity within 70% of the maximum sensitivity is indicated by range 40 in FIG. 8 and range 42 in FIG. 9 (for 3-layer TERFENOL-D+soft PZT devices).

It is noted that although the present sensors have been illustrated with MS layers and PZ layers having the same L and T dimensions, the invention is not so limited. For example, the PZ layers can have a L dimension or T-dimension larger or smaller than the MS layers. For example, making the PZ layers with a larger L-dimension in the L-P configuration can provide more surface area for electrode attachment.

Although the present magnetic field sensors have been illustrated as having MS layers with a rectangular shape, any shape is possible. For example, the MS layers and PZ layer can have a circular or elliptical shape. If an elliptical shape is used, then the major axis of the ellipse will be the longitudinal dimension L, and the minor axis will be the transverse dimension T.

It will be clear to one skilled in the art that the above embodiment may be altered in many ways without departing from the scope of the invention. Accordingly, the scope of the invention should be determined by the following claims and their legal equivalents.

What is claimed is:

1. A magnetoelectric magnetic field sensor, comprising:
   a) a magnetostrictive layer having a longitudinal bias magnetic field, wherein the magnetostrictive layer has a L/T aspect ratio greater than 1;
   b) a piezoelectric layer bonded to the magnetostrictive layer; and
   c) a means for creating the longitudinal bias magnetic field in the magnetostrictive layer.

2. The magnetoelectric magnetic field sensor of claim 1, wherein the bias magnetic field is in the range of 100–1000 Oersteds.

3. The magnetoelectric magnetic field sensor of claim 1, wherein the piezoelectric layer is poled in the perpendicular direction.

4. The magnetoelectric magnetic field sensor of claim 1, wherein the piezoelectric layer is poled in the longitudinal direction.

5. The magnetoelectric magnetic field sensor of claim 1, wherein the magnetostrictive layer has an L/T aspect ratio of at least 2.

6. The magnetoelectric magnetic field sensor of claim 1, wherein the magnetostrictive layer has an L/T aspect ratio in the range of 1.2–1000.

7. The magnetoelectric magnetic field sensor of claim 1, further comprising a second magnetostrictive layer bonded to the piezoelectric layer.

8. The magnetoelectric magnetic field sensor of claim 1, further comprising a plurality of alternating magnetostrictive layers and piezoelectric layers.

9. The magnetoelectric magnetic field sensor of claim 1, further comprising a voltage detector electrically connected to the piezoelectric layer, and wherein a piezoelectric capacitance and an internal resistance of the voltage detector have an RC cutoff frequency of less than 1 Hz.

10. The magnetoelectric magnetic field sensor of claim 1, wherein the piezoelectric layer is perpendicularly poled, and a ratio of $$\frac{\text{total magnetostrictive layer thickness}}{\text{total device thickness}}$$

is in a range that provides a sensitivity within 70% of a maximum sensitivity calculated according to Equation (1).

11. The magnetoelectric magnetic field sensor of claim 1, wherein the piezoelectric layer is longitudinally poled, and a ratio of $$\frac{\text{total magnetostrictive layer thickness}}{\text{total device thickness}}$$

is in a range that provides a sensitivity within 70% of a maximum sensitivity according to Equation (1).

12. The magnetoelectric magnetic field sensor of claim 1, wherein the piezoelectric layer is perpendicularly poled, and a ratio of $$\frac{\text{total magnetostrictive layer thickness}}{\text{total device thickness}}$$

is in a range that provides a sensitivity within 85% of a maximum sensitivity calculated according to Equation (1).

13. The magnetoelectric magnetic field sensor of claim 1, wherein the piezoelectric layer is longitudinally poled, and a ratio of is in a range that provides a sensitivity within 85% of a maximum sensitivity according to Equation (3).

14. The magnetoelectric magnetic field sensor of claim 1, wherein the piezoelectric layer is longitudinally poled, and a ratio of $$\frac{\text{total magnetostrictive layer thickness}}{\text{total device thickness}}$$

is in the range 0.5–0.8.

15. A magnetoelectric magnetic field sensor, comprising:
   a) one or more magnetostrictive layers having a longitudinal magnetization;
   b) one or more piezoelectric layers bonded to the magnetostrictive layer, and
   wherein a thickness ratio of adjacent magnetostrictive and piezoelectric layers is within 50% of a value given by the equation $$n_{optim} = \frac{1}{1 + \sqrt{\alpha}}.$$

16. The magnetoelectric magnetic field sensor of claim 15, wherein the piezoelectric layer is perpendicularly poled, and $$\alpha = \left(1 - k_{31,p}^2\right)\frac{s_{11}^E}{s_{33}^H}.$$

17. The magnetoelectric magnetic field sensor of claim 15, wherein the piezoelectric layer is longitudinally poled, and $$\alpha = \frac{s_{33}^D}{s_{33}^H}.$$

18. The magnetoelectric magnetic field sensor of claim 15, wherein a thickness ratio of adjacent magnetostrictive and piezoelectric layers is within 25% of a value given by the equation $$n_{optim} = \frac{1}{1 + \sqrt{\alpha}}.$$

19. A magnetoelectric magnetic field sensor, comprising:
   a) a magnetostrictive layer having a longitudinal bias magnetic field, wherein the magnetostrictive layer has a L/T aspect ratio greater than 1.5;
   b) a piezoelectric layer bonded to the magnetostrictive layer; and
   c) a permanent magnet for creating the longitudinal bias magnetic field in the magnetostrictive layer.

20. The magnetoelectric magnetic field sensor of claim 1, further comprising a voltage detector operable for detecting a voltage created by the piezoelectric layer.

21. The magnetoelectric magnetic field sensor of claim 15, further comprising a voltage detector operable for detecting a voltage created by the piezoelectric layer.

22. The magnetoelectric magnetic field sensor of claim 19, further comprising a voltage detector operable for detecting a voltage created by the piezoelectric layer.

\* \* \* \* \*